(12) United States Patent
Panda et al.

(10) Patent No.: US 10,903,112 B2
(45) Date of Patent: Jan. 26, 2021

(54) METHODS AND APPARATUS FOR SMOOTHING DYNAMIC RANDOM ACCESS MEMORY BIT LINE METAL

(71) Applicant: APPLIED MATERIALS, INC., Santa Clara, CA (US)

(72) Inventors: Priyadarshi Panda, Newark, CA (US); Jianxin Lei, Fremont, CA (US); Sanjay Natarajan, Portland, OR (US); In Seok Hwang, Santa Clara, CA (US); Nobuyuki Sasaki, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/690,620

(22) Filed: Nov. 21, 2019

(65) Prior Publication Data

US 2020/0126844 A1    Apr. 23, 2020

Related U.S. Application Data

(63) Continuation-in-part of application No. 16/189,487, filed on Nov. 13, 2018, now Pat. No. 10,529,602, and
(Continued)

(51) Int. Cl.
| | |
|---|---|
| *H01L 21/768* | (2006.01) |
| *H01L 21/285* | (2006.01) |
| *H01L 21/02* | (2006.01) |

(52) U.S. Cl.
CPC ...... *H01L 21/7685* (2013.01); *H01L 21/0217* (2013.01); *H01L 21/02167* (2013.01);
(Continued)

(58) Field of Classification Search
CPC .......... H01L 21/7685; H01L 21/28518; H01L 21/0217; H01L 21/2855; H01L 21/02167;
(Continued)

(56) References Cited

U.S. PATENT DOCUMENTS

| | | |
|---|---|---|
| 5,100,826 A | 3/1992 | Dennison |
| 6,278,152 B1 | 8/2001 | Hieda et al. |
| (Continued) | | |

OTHER PUBLICATIONS

International Search Report for PCT/US2019/054174, dated Jan. 17, 2020.

*Primary Examiner* — Cuong B Nguyen
*Assistant Examiner* — Juanita B Rhodes
(74) *Attorney, Agent, or Firm* — Moser Taboada

(57) ABSTRACT

A process of smoothing a top surface of a bit line metal of a memory structure decreases resistance of a bit line stack. The process includes depositing a titanium layer of approximately 30 angstroms to 50 angstroms on a polysilicon layer on a substrate, depositing a first titanium nitride layer of approximately 15 angstroms to approximately 40 angstroms on the titanium layer, annealing the substrate at a temperature of approximately 700 degrees Celsius to approximately 850 degrees Celsius, depositing a second titanium nitride layer of approximately 15 angstroms to approximately 40 angstroms on the first titanium nitride layer after annealing, and depositing a bit line metal layer of ruthenium on the second titanium nitride layer.

20 Claims, 6 Drawing Sheets

Related U.S. Application Data a continuation-in-part of application No. 16/164,236, filed on Oct. 18, 2018, now Pat. No. 10,700,072.

(52) U.S. Cl.
CPC .... *H01L 21/2855* (2013.01); *H01L 21/28518* (2013.01); *H01L 21/28568* (2013.01); *H01L 21/76841* (2013.01)

(58) Field of Classification Search
CPC ......... H01L 21/76841; H01L 21/28568; H01L 21/0337; H01L 23/53266; H01L 23/53252; H01L 21/76885; H01L 21/76864; H01L 27/10882
See application file for complete search history.

(56) References Cited

U.S. PATENT DOCUMENTS

| | | | |
|---|---|---|---|
| 6,383,863 B1 | 5/2002 | Chiang et al. | |
| 6,583,463 B1 | 6/2003 | Nakanishi et al. | |
| 6,664,636 B2 | 12/2003 | Pyo et al. | |
| 6,803,272 B1 | 10/2004 | Halliyal et al. | |
| 6,824,825 B2 | 11/2004 | Otsuki | |
| 7,030,012 B2 | 4/2006 | Divakaruni et al. | |
| 7,473,954 B2 | 1/2009 | Jeong et al. | |
| 8,309,374 B2 | 11/2012 | Porthouse et al. | |
| 8,835,311 B2 | 9/2014 | Collins et al. | |
| 9,960,045 B1 | 5/2018 | Purayath et al. | |
| 10,043,670 B2 | 8/2018 | Ramalingam et al. | |
| 2003/0054602 A1 | 3/2003 | Pan et al. | |
| 2003/0068856 A1 | 4/2003 | Okumoto et al. | |
| 2004/0058480 A1 | 3/2004 | Nesbit et al. | |
| 2004/0087163 A1 | 5/2004 | Steimle et al. | |
| 2004/0120198 A1 | 6/2004 | Schwalbe et al. | |
| 2004/0214417 A1* | 10/2004 | Rich | C23C 14/165 438/592 |
| 2007/0237608 A1 | 10/2007 | Jang et al. | |
| 2008/0055978 A1* | 3/2008 | Ishibashi | H01L 27/11521 365/185.2 |
| 2009/0046501 A1 | 2/2009 | Ranjan et al. | |
| 2010/0062603 A1 | 3/2010 | Ganguly et al. | |
| 2010/0178729 A1 | 7/2010 | Yoon et al. | |
| 2012/0064682 A1* | 3/2012 | Jang | H01L 27/11578 438/268 |
| 2012/0214303 A1* | 8/2012 | Ganguli | H01L 21/68785 438/664 |
| 2012/0306081 A1* | 12/2012 | Ishizaki | H01L 21/764 257/751 |
| 2014/0001576 A1* | 1/2014 | Gandikota | H01L 29/66477 257/412 |
| 2014/0187038 A1* | 7/2014 | Collins | H01L 21/743 438/653 |
| 2015/0093891 A1* | 4/2015 | Zope | H01L 21/76876 438/618 |
| 2017/0117153 A1* | 4/2017 | Ramalingam | H01J 37/3435 |
| 2018/0190662 A1* | 7/2018 | Wu | H01L 27/10876 |

\* cited by examiner

METHODS AND APPARATUS FOR SMOOTHING DYNAMIC RANDOM ACCESS MEMORY BIT LINE METAL

CROSS-REFERENCE TO RELATED APPLICATIONS

This application is a continuation-in-part and claims the benefit of co-pending U.S. patent application Ser. No. 16/164,236, filed Oct. 18, 2018, and this application is also a continuation-in-part and claims the benefit of co-pending U.S. patent application Ser. No. 16/189,487, filed Nov. 13, 2018, both of which are herein incorporated by reference in their entirety.

FIELD

Embodiments of the present disclosure pertain to the field of electronic devices and electronic device manufacturing. More particularly, embodiments of the disclosure provide electronic devices including a bit line with smooth top surface and methods of forming same.

BACKGROUND

The electrically-conductive interconnect layers of modern integrated circuits are generally of very fine pitch and high density. A single, small defect in the precursor metal film which ultimately forms a metallic interconnect layer of an integrated circuit can be so positioned as to seriously damage the operational integrity of the integrated circuit. Bit line stack deposition suffers from a number of potential issues. Surface reaction of the metal and silicon nitride hardmask can occur due to high deposition temperatures experienced in the formation of the hardmask. The bit line resistance can increase due to inter-diffusion of silicon into the bit line and metal atoms into the silicon nitride hardmask. Additionally, grain growth metals can be difficult to use due to metal surface roughness caused by high temperatures during formation.

Thus, the inventors have provided a method and apparatus for smoothing a top surface of a bit line metal.

SUMMARY

Methods and apparatus for smoothing a top surface of a bit line metal are provided herein.

In some embodiments, a method of smoothing a top surface of a bit line metal of a memory structure includes depositing a titanium layer of approximately 30 angstroms to approximately 50 angstroms on a polysilicon layer on a substrate, depositing a first titanium nitride layer of approximately 15 angstroms to approximately 40 angstroms on the titanium layer, annealing the substrate at a temperature of approximately 700 degrees Celsius to approximately 850 degrees Celsius, depositing a second titanium nitride layer of approximately 15 angstroms to approximately 40 angstroms on the first titanium nitride layer after annealing, and depositing a bit line metal layer of ruthenium on the second titanium nitride layer.

In some embodiments, the method may further include depositing a cap layer on the bit line metal layer at a deposition temperature of approximately 350 degrees Celsius to approximately 400 degrees Celsius and depositing a hardmask layer on the cap layer at a deposition temperature of greater than approximately 500 degrees Celsius; wherein the cap layer comprises one or more of silicon nitride or silicon carbonitride; wherein the cap layer is approximately 30 angstroms to approximately 50 angstroms; wherein the cap layer is deposited by a chemical vapor deposition (CVD) or atomic layer deposition (ALD) process; wherein the hardmask comprises silicon nitride; wherein the hardmask is deposited using a low pressure chemical vapor deposition (LPCVD) process; depositing a hardmask layer on the bit line metal layer at a deposition temperature of less than approximately 400 degrees Celsius; wherein the hardmask comprises silicon nitride; and/or wherein the hardmask is deposited using a low pressure chemical vapor deposition (LPCVD) process.

In some embodiments, a method of forming a memory structure may include forming a barrier metal layer on a polysilicon layer on a substrate, annealing the barrier metal layer at a temperature of approximately 700 degrees Celsius to approximately 850 degrees Celsius, forming a barrier layer on the barrier metal layer, and forming a bit line metal layer on the barrier layer.

In some embodiments, the method may further include wherein the barrier metal layer is a titanium layer of approximately 30 angstroms to approximately 50 angstroms formed on the polysilicon layer and a titanium nitride layer of approximately 15 angstroms to approximately 40 angstroms formed on the titanium layer; wherein annealing the barrier metal layer forms a titanium silicide layer on the polysilicon layer; wherein the barrier layer is a titanium nitride layer of approximately 15 angstroms to approximately 40 angstroms; wherein the bit line metal layer is a grain growth metal layer; forming a cap layer on the bit line metal layer using a chemical vapor deposition (CVD) or atomic layer deposition (ALD) process at a deposition temperature of approximately 350 degrees Celsius to approximately 400 degrees Celsius and forming a hardmask layer on the cap layer using a low pressure chemical vapor deposition (LPCVD) process at a deposition temperature of greater than approximately 500 degrees Celsius; wherein the cap layer is approximately 30 angstroms to approximately 50 angstroms; and/or depositing a hardmask layer on the bit line metal layer using a low pressure chemical vapor deposition (LPCVD) process at a deposition temperature of less than approximately 400 degrees Celsius.

In some embodiments, a method of smoothing a top surface of a bit line metal of a memory structure may include depositing a titanium layer of approximately 30 angstroms to approximately 50 angstroms on a polysilicon layer on a substrate using a plasma vapor deposition (PVD) chamber, annealing the substrate at a temperature of approximately 700 degrees Celsius to approximately 850 degrees Celsius without a vacuum break between the depositing of the titanium layer and the annealing of the substrate, depositing a titanium nitride layer of approximately 15 angstroms to approximately 40 angstroms on the titanium layer after annealing, and depositing a bit line metal layer of ruthenium on the titanium nitride layer.

In some embodiments, the method may further include depositing a cap layer on the bit line metal layer at a deposition temperature of approximately 350 degrees Celsius to approximately 400 degrees Celsius and depositing a hardmask layer on the cap layer at a deposition temperature of greater than approximately 500 degrees Celsius or depositing a hardmask layer on the bit line metal layer at a deposition temperature of less than approximately 400 degrees Celsius.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
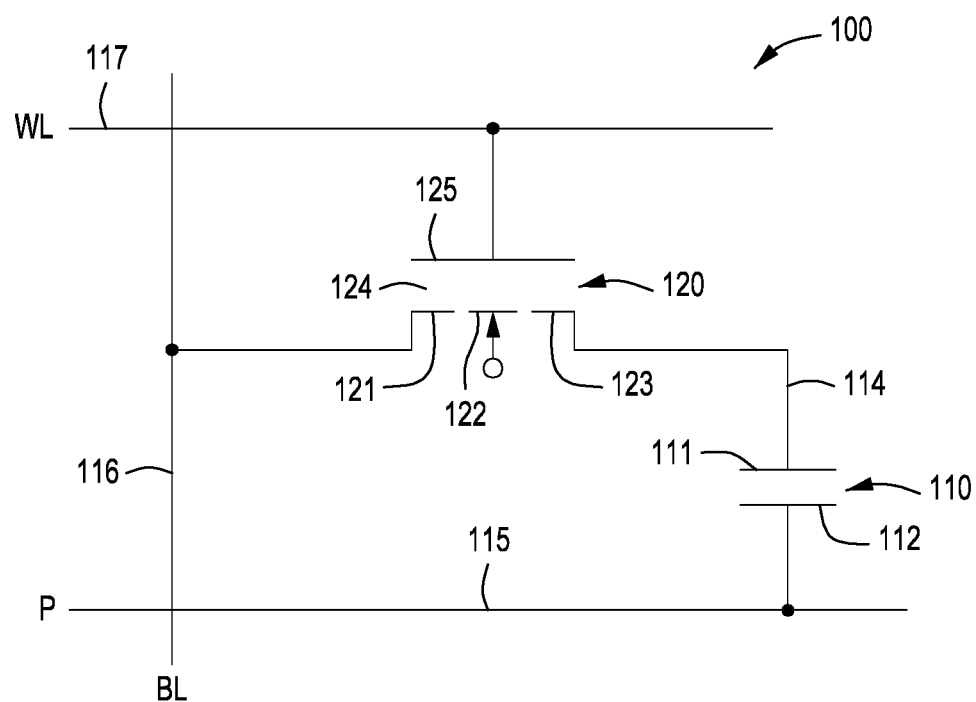
FIG. 1 depicts a circuit diagram of a dynamic memory cell in a DRAM memory having improved properties in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Bit line stacks and methods for forming bit line stacks with reduced resistance and bit line surface roughness are provided. One or more embodiments of the disclosure advantageously address the issue of resistivity reduction in spite of the need for shrinking nodes. In some embodiments, the resistivity of the bit line is reduced by providing cleaner interfaces with existing bit line metals and by reducing surface roughness of the bit line metal. Some embodiments of the disclosure advantageously provide one or more of flexibility in choice of the bit line metal; flexibility of temperature for silicon nitride hardmask deposition; ensure clean metal-dielectric interfaces resulting in lower resistivity; or minimizes or eliminates risk of contamination of high temperature silicon nitride hardmask deposition chamber by new bit line metals.

Some embodiments of the disclosure provide low temperature deposition methods using a cap layer to prevent roughening of the bit line metal surface when metal of choice exhibits grain growth characteristics. In some embodiments, high density non-porous films are used to act as good diffusion barriers at elevated temperatures. Some embodiments provide dielectric materials, such as silicon nitride (SiN) or silicon carbonitride (SiCN), to act as a cap film to minimize or eliminate adverse impact on the RC time constant by acting as a good diffusions barrier for bit line metal and SiN hardmask. Some embodiments include annealing a metal layer prior to deposition of a grain growth metal to decrease the surface roughness of the grain growth metal, reducing resistance. The RC time constant is the time associated with charging a capacitor through a resistor to a percentage of full charge or to discharge the capacitor to a fraction of the initial voltage. The RC time constant is equal to the product of the circuit resistance and the circuit capacitance. Some embodiments of the disclosure advantageously provide deposition processes at low temperatures (e.g., <500° C.). Some embodiments provide compatible deposition processes with underlying bit line metals to minimize or eliminate surface reactions during film deposition.

One or more embodiments of the disclosure generally provide structures which include one or more low-resistivity features formed from a thin film refractory metal (e.g., tungsten) as may be implemented in bit line structures and/or gate stacks. Some embodiments include methods for forming bit line stacks. By way of example, a bit line stack structure formed in accordance with embodiments of the present disclosure may be a memory type semiconductor device, such as a DRAM type integrated circuit.

FIG. 1 illustrates a schematic circuit diagram 100 of a one transistor one capacitor cell such as may be used in DRAM memories. The memory cell depicted in FIG. 1 comprises a storage capacitor 110 and a selection transistor 120. The selection transistor 120 is formed as a field effect transistor and has a first source/drain electrode 121 and a second source/drain electrode 123 between which an active region 122 is arranged. Above the active region 122 are the gate insulating layer or dielectric layer 124, typically a thermally grown oxide, and gate electrode/metal 125 (called word line in memory devices), together which act like a plate capacitor and can influence the charge density in the active region 122 in order to form or block a current conducting channel between the first source/drain electrode 121 and the second source/drain electrode 123.

The second source/drain electrode 123 of the selection transistor 120 is connected to a first electrode 111 of the storage capacitor 110 via a metal line 114. A second electrode 112 of the storage capacitor 110 is in turn connected to a capacitor plate which may be common to storage capacitors of the DRAM memory cell arrangement. The second electrode 112 of storage capacitor 110 can be connected to electrical ground via metal line 115. The first source/drain electrode 121 of the selection transistor 120 is furthermore connected to a bit line 116 in order that the information stored in storage capacitor 110 in the form of charges can be written in and read out. The write in or read out operation is controlled via a word line 117 or gate electrode 125 of the selection transistor 120 and bit line 116 which is connected to the first source/drain electrode 121. The write in or read out operation occurs by applying a voltage to produce a current conducting channel in the active region 122 between the first source/drain electrode 121 and the second source/drain electrode 123.

Figure 2:
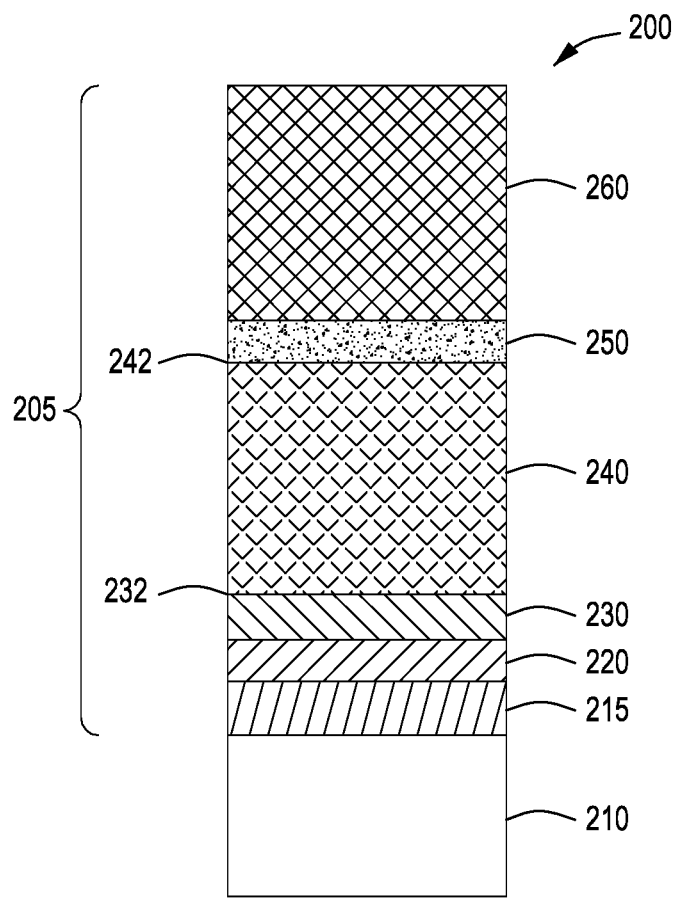
FIG. 2 depicts a cross-sectional view of a film stack in accordance with some embodiments of the present principles.
Figure 3:
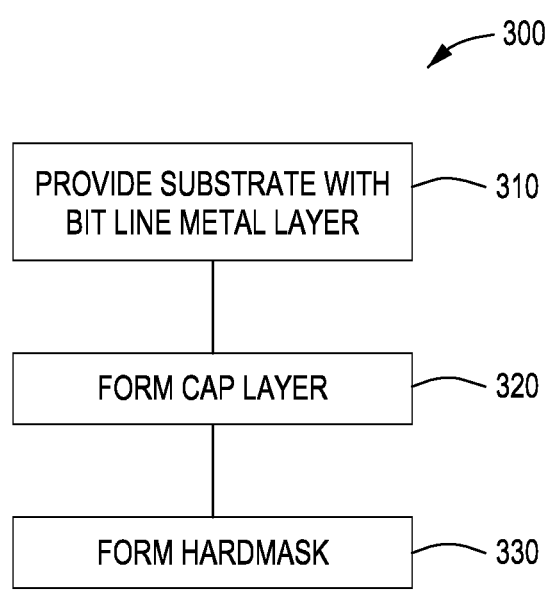
FIG. 3 is a method of forming a film stack in accordance with some embodiments of the present principles.

FIG. 2 illustrates a portion of a memory device 200 in accordance with one or more embodiment of the disclosure. FIG. 3 illustrates an exemplary processing method 300 for forming the memory device 200 illustrated in FIG. 2. The skilled artisan will recognize that the film stacks illustrated in the drawings is an exemplary portion (the bit line portion) of a memory device. Referring to FIGS. 2 and 3, formation of the memory device 200 comprises, at operation 310, providing a substrate 210 upon which a film stack 205 can be formed. As used in the specification and the appended claims, the term "provided" means that the substrate is made available for processing (e.g., positioned in a processing chamber).

As used in the specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon. A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

In some embodiments, the substrate 210 provided comprises a film stack 205 comprising a polysilicon layer 215 and a bit line metal layer 240. In some embodiments, the substrate 210 provided comprises a polysilicon layer 215 and the bit line metal layer 240 is formed as part of method 300. In some embodiments, the substrate 210 comprises an oxide layer (not shown) on a silicon wafer. In some embodiments, the oxide layer is a native oxide formed on the silicon wafer. In some embodiments, the oxide layer is intentionally formed on the silicon wafer and has a thickness greater than the thickness of a native oxide film. The oxide layer can be formed by any suitable technique known to the skilled artisan including, but not limited to, thermal oxidation, plasma oxidation and exposure to atmospheric conditions.

In some embodiments, the substrate 210 provided in operation 310 further comprises a barrier metal layer 220 (also referred to as a conductive layer) on the polysilicon layer 215. The barrier metal layer 220 can be any suitable conductive material. In some embodiments, the barrier metal layer 220 comprises one or more of titanium (Ti), tantalum (Ta), titanium silicide (TiSi) or tantalum silicide (TaSi). In some embodiments, the barrier metal layer 220 comprises titanium. In some embodiments, the barrier metal layer 220 consists essentially of titanium. In some embodiments, the barrier metal layer 220 comprises or consists essentially of tantalum. In some embodiments, the barrier metal layer 220 comprises or consists essentially of titanium silicide. In some embodiments, the barrier metal layer 220 comprises or consists essentially of tantalum silicide. As used in this manner, the term "consists essentially of" means that the subject film comprises greater than or equal to about 95%, 98%, 99% or 99.9% of the stated element or composition, on an atomic basis. For example, a barrier metal layer 220 consisting essentially of titanium has a film that is greater than or equal to about 95%, 98%, 99% or 99.5% titanium as deposited.

In some embodiments, the substrate 210 provided in operation 310 further comprises a barrier layer 230 on the conductive layer (barrier metal layer 220). The barrier layer 230 can be formed between the barrier metal layer 220 and the bit line metal layer 240. In some embodiments, the method 300 includes an operation before operation 310 where the bit line metal layer 240 is formed on the barrier layer 230. The barrier layer 230 can be any suitable barrier layer material. In some embodiments, the barrier layer 230 comprises one or more of a nitride or an oxide of the barrier metal layer 220. In some embodiments, the barrier layer 230 consists essentially of a nitride of the barrier metal layer 220. For example, a barrier layer 230 consisting essentially of titanium nitride means that the sum of the titanium and nitrogen atoms in the film make up greater than or equal to about 95%, 98%, 99% or 99.5% of the barrier layer 230 on an atomic basis as deposited.

In some embodiments, the barrier metal layer 220 comprises titanium (Ti) and the barrier layer 230 comprises titanium nitride (TiN). In some embodiments, the barrier metal layer 220 consists essentially of titanium and the barrier layer 230 consists essentially of titanium nitride. In one or more embodiments, the barrier metal layer 220 comprises a metal selected from one or more of cobalt (Co), copper (Cu), nickel (Ni), ruthenium (Ru), manganese (Mn), silver (Ag), gold (Au), platinum (Pt), iron (Fe), molybdenum (Mo), rhodium (Rh), titanium (Ti), tantalum (Ta), silicon (Si), or tungsten (W). In one or more specific embodiments, the barrier metal layer 220 (conductive material) comprises one or more of titanium (Ti), copper (Cu), cobalt (Co), tungsten (W), or ruthenium (Ru). In some embodiments, the barrier layer 230 comprises a nitride, oxynitride, carbonitride, or oxycarbonitride of the metal in barrier metal layer 220. In some embodiments, the barrier metal layer 220 comprises (or consists essentially of) tantalum or tantalum silicide and the barrier layer 230 comprises (or consists essentially of) tantalum nitride. In some embodiments, the barrier metal layer 220 comprises (or consists essentially of) titanium or titanium silicide and the barrier layer 230 comprises (or consists essentially of) titanium nitride.

In some embodiments, the bit line metal layer 240 is included in the substrate provided in operation 310 of method 300. The bit line metal layer 240 can be deposited by any suitable technique known to the skilled artisan. In some embodiments, the bit line metal layer 240 comprises one or more of tungsten (W), ruthenium (Ru), iridium (Ir), platinum (Pt), rhodium (Rh) or molybdenum (Mo). In some specific embodiments, the bit line metal layer 240 comprises or consists essentially of one or more of ruthenium or tungsten. The thickness of the bit line metal layer 240 can be varied. In some embodiments, the bit line metal layer 240 has a thickness in a range of about 100 Å to about 300 Å, or in the range of about 120 Å to about 250 Å, or in the range of about 140 Å to about 200 Å, or in the range of about 160 Å to about 180 Å. The bit line metal layer 240 can be deposited by any suitable technique known to the skilled artisan. In some embodiments, the bit line metal layer 240 is deposited by one or more of chemical vapor deposition, atomic layer deposition or physical vapor deposition.

At operation 320, a cap layer 250 is formed on the bit line metal layer 240. The cap layer 250 of some embodiments is deposited at a lower temperature than would typically be used for formation of a subsequent hardmask 260 layer. Without being bound by any particular theory of operation, the inventors believe that the lower deposition temperature minimizes diffusion of the cap layer 250 elements into the bit line metal layer 240. In some embodiments, the inventors believe that the low temperature deposition of the cap layer 250 minimizes grain growth at the bit line metal layer 240 interface and minimizes the effect of grain size and roughness on the resistivity of the resulting bit line metal layer 240.

The cap layer 250 can be deposited by any suitable technique known to the skilled artisan. In some embodiments, the cap layer 250 is deposited by one or more of chemical vapor deposition or atomic layer deposition. The cap layer 250 of some embodiments comprises the same compound as a subsequent hardmask 260. In some embodiments, the cap layer 250 comprises one or more of silicon nitride, silicon carbonitride or silicon carbide. In some embodiments, the cap layer 250 consists essentially of silicon nitride. In some embodiments, the cap layer 250 consists essentially of silicon carbonitride. In some embodiments, the cap layer 250 consists essentially of silicon carbide. The thickness of the cap layer 250 can be varied to minimize the impact of high temperature formation of a hardmask 260. In some embodiments, the cap layer 250 has a thickness in the range of about 30 Å to about 50 Å. The deposition temperature of the cap layer 250 can be controlled to, for example, preserve the thermal budget of the device being formed. In some embodiments, the cap layer 250 is formed at a temperature less than or equal to about 500° C., or about 450° C., or about 400° C., or about 350° C., or about 300° C. In some embodiments, the cap layer 250 is formed at a temperature in the range of about 350° C. to about 550° C., or in the range of about 400° C. to about 500° C.

At operation 330, a hardmask 260 is formed on the cap layer 250. The hardmask 260 of some embodiments is formed in a furnace at a temperature greater than about 500° C., about 600° C., about 650° C., about 700° C. or about 750° C. In some embodiments, the hardmask 260 comprises the same composition as the cap layer 250. In some embodiments, cap layer 250 and the hardmask 260 comprise or consist essentially of silicon nitride, silicon oxide or silicon nitride. In some embodiments, the hardmask 260 has a different density than the cap layer 250. In some embodiments, the hardmask 260 has a different porosity than the hardmask 260. In some embodiments, the hardmask 260 has a different deposition temperature than cap layer 250.

In some embodiments, the bit line metal layer 240 comprises or consists essentially of tungsten and one or more of the cap layer 250 or hardmask 260 comprises or consists essentially of silicon nitride. In some embodiments, the bit line metal layer 240 comprises or consists essentially of ruthenium and one or more of the cap layer 250 or hardmask 260 comprises or consists essentially of silicon oxide or silicon nitride. In some embodiments, the elements of the hardmask 260 are substantially prevented from migrating into the bit line metal layer 240. For example, if the hardmask 260 comprises silicon and nitrogen atoms, silicon or nitrogen atoms are substantially prevented from migrating into the bit line metal layer 240. As used in this manner, the term "substantially prevented" means that less than or equal to about 10% or 5% of the hardmask 260 elements migrate into the bit line metal layer 240 through the cap layer 250.

The inventors have found that when annealing the grain growth metal to reduce resistance prior to forming the cap layer 250, the annealing would silicize the underlying barrier metal layer 220. In addition, silicon is diffused into the barrier layer 230. The additional stresses caused by the annealing of the grain growth metal ruptures the surface 232 of the barrier layer 230. When the grain growth metal of the bit line metal layer 240 is grown on the ruptured surface of the barrier layer 230, the ruptured surface of the barrier layer 230 causes the bit line metal layer 240 to also have a roughened top surface 242. The roughness of the top surface 242 of the bit line metal layer 240 directly impacts the resistivity of the bit line metal layer 240. The inventors discovered that by annealing the barrier metal layer 220 prior to forming the barrier layer 230, the silicidation impact caused by annealing of the grain growth metal of the bit line metal layer 240 is significantly reduced or eliminated, allowing a smoother top surface 242 of the bit line metal layer 240, reducing resistivity.

Figure 4:
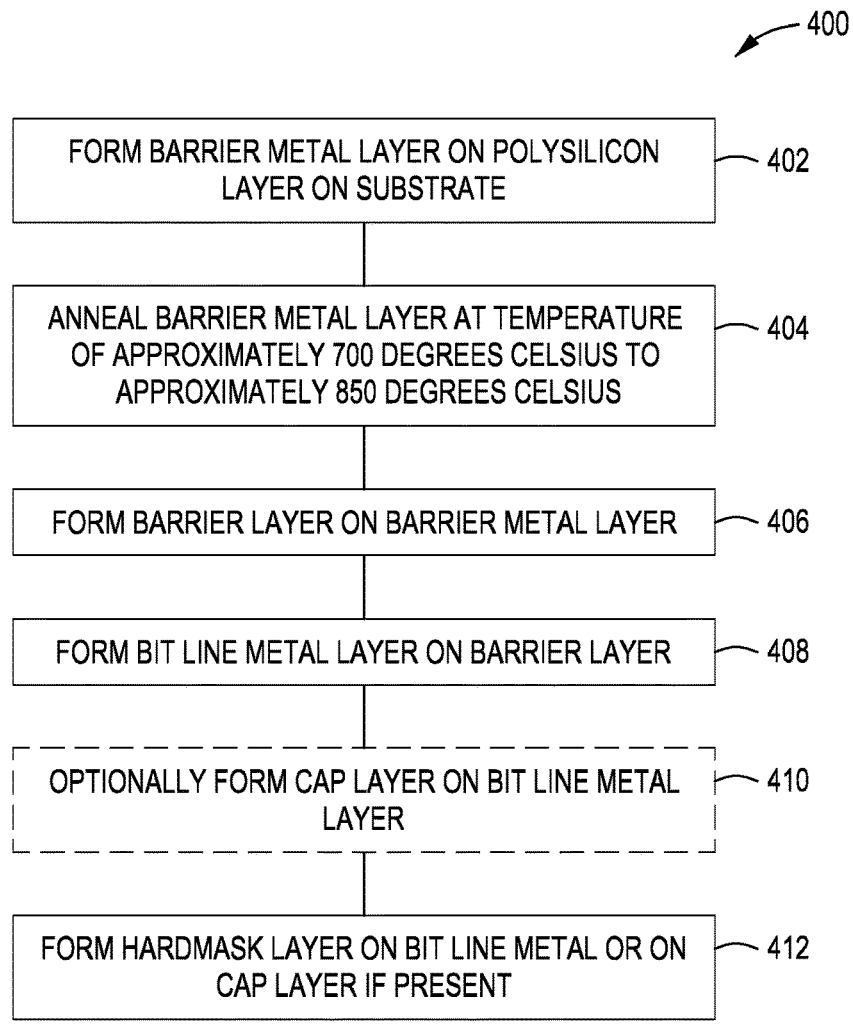
FIG. 4 is a method of forming a film stack with a smooth bit line metal layer in accordance with some embodiments of the present principles.
Figure 5:
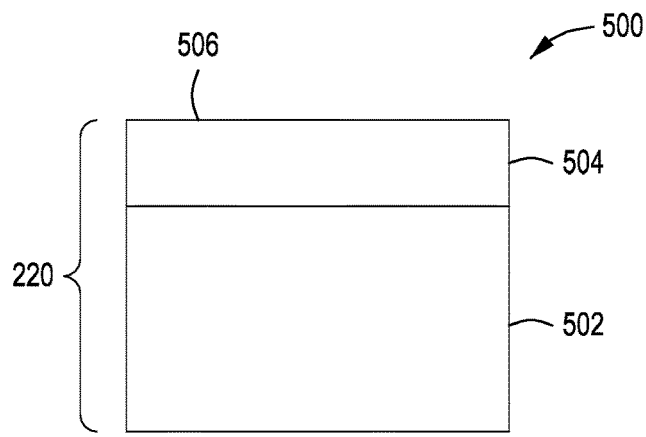
FIG. 5 is a cross-sectional view of a barrier metal layer in accordance with some embodiments of the present principles.
Figure 6:
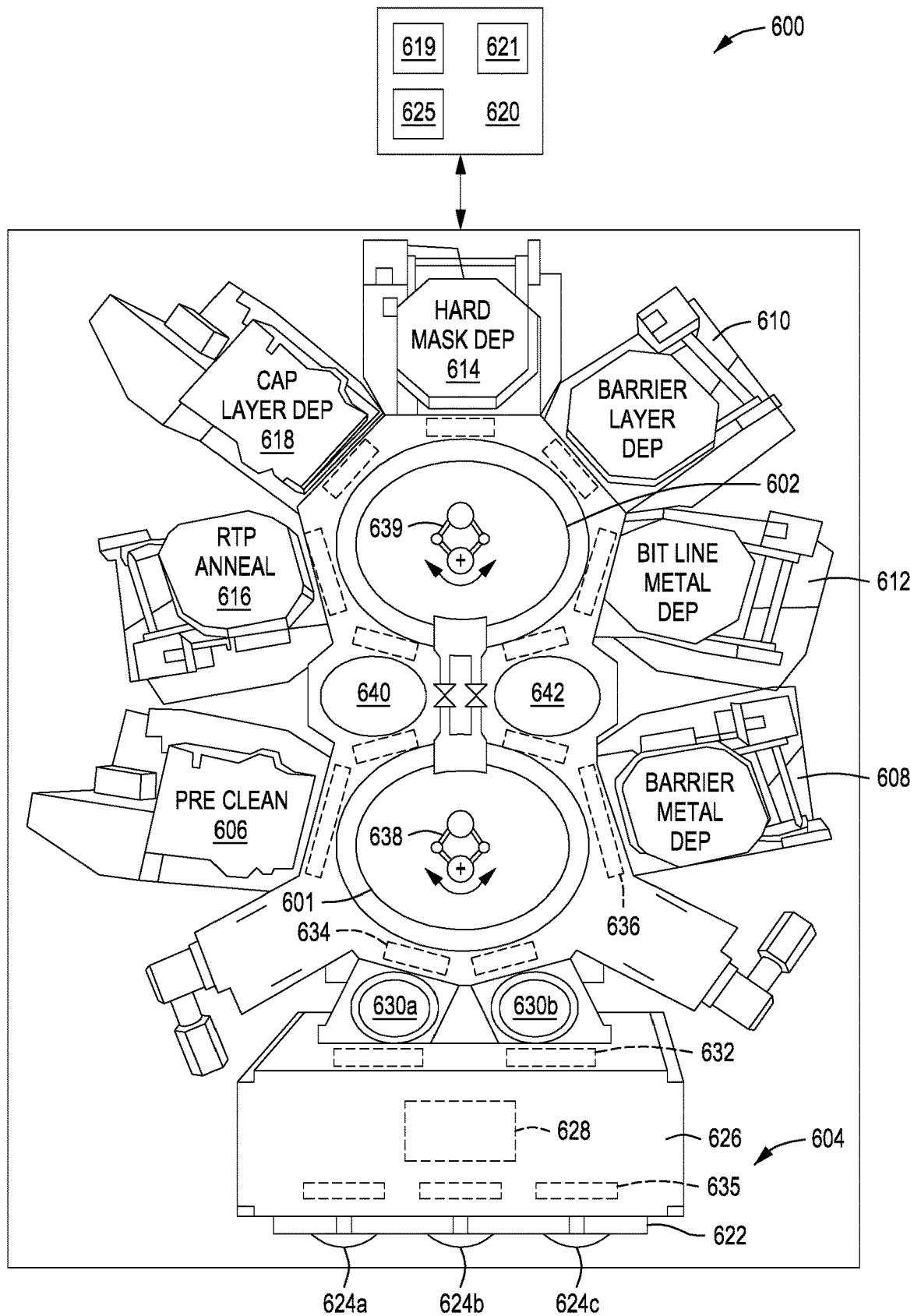
FIG. 6 is a top-down view of a cluster tool in accordance with some embodiments of the present principles.

FIG. 4 is a method 400 of forming a film stack with a smooth bit line metal layer 240. At operation 402, a barrier metal layer 220 is formed on the polysilicon layer 215 on the substrate 210. In some embodiments, the barrier metal layer 220 is formed by first depositing a conductive material 502 (e.g., titanium, tantalum, etc.) of approximately 30 angstroms to approximately 50 angstroms and then depositing an oxygen barrier layer 504 of approximately 15 angstroms to approximately 40 angstroms (see view 500 of FIG. 5). In processes with separate chambers for deposition and annealing, the substrate 210 is exposed to atmosphere when transported between chambers. The oxygen barrier layer 504 (e.g., titanium nitride, tantalum nitride, etc.) prevents the conductive material 502 from oxidizing as the substrate 210 is transported. In some embodiments, an integrated tool 600 as illustrated in FIG. 6 can be used to provide processing without an air break between deposition and annealing processes. In embodiments with the integrated tool 600, the oxygen barrier layer 504 deposition process can be removed because the substrate is never exposed to atmosphere and the deposited conductive material 502 will not be oxidized.

At operation 404, the barrier metal layer 220 is annealed at a temperature of approximately 700 degrees Celsius to approximately 850 degrees Celsius. The temperature may vary depending on the composition of the barrier metal layer 220. During the annealing of the barrier metal layer 220, the conductive material 502 is silicidized and the oxygen barrier layer 504 may have silicon move through the oxygen barrier layer 504, rupturing the surface 506. At operation 406, the barrier layer 230 is formed on the barrier metal layer 220. The barrier layer 230 may be approximately 15 angstroms to approximately 40 angstroms in thickness. Imperfections on the surface 506 may be occluded by the deposition of the barrier layer 230, assisting in reducing roughness and resistivity. The barrier layer 230 may comprise, for example, a nitride variant of the conductive material 502 used in the barrier metal layer 220. At operation 408, the bit line metal layer 240 is formed on the barrier layer 230. The bit line metal layer 240 is comprised of a grain growth metal which is grown on the surface of the barrier layer 230. When the grain growth is completed, the bit line metal layer 240 is annealed as noted above.

At operation 410, a cap layer 250 may be optionally formed on the bit line metal layer 240 at a temperature of approximately 350 degrees Celsius to approximately 400 degrees Celsius. The low process temperature helps to preserve the thermal budget of the film stack 205 and to reduce roughness of the bit line metal layer surface. The inventors have found that if the temperature is too low the density of the cap layer 250 is insufficient, and if the temperature is too high, the bit line metal layer surface roughness is increased. The temperature is also dependent on the bit line metal layer material and is adjusted accordingly. At operation 412, the hardmask 260 is formed on the cap layer 250 when present at a temperature of approximately 650 degrees Celsius as described above. If a cap layer is not present, the hardmask 260 may be formed at a temperature of less than 400 degrees Celsius to preserve the thermal budget of the film stack 205. The lower temperature used to form the hardmask layer 260 when the cap layer 250 is not present is a tradeoff due to increased deposition times (e.g., hardmask may be approximately 1350 angstroms thick) and a lower density of the hardmask layer 260.

The methods described herein performed in individual process chambers may also be performed in a cluster tool, for example, cluster tool 600 or integrated tool described below with respect to FIG. 6. The advantage of using a cluster tool 600 is that there is no vacuum break and no substantial process lag between depositions and treatments. Examples of the cluster tool 600 include the ENDURA® integrated tools, available from Applied Materials, Inc., of Santa Clara, Calif. However, the methods described herein may be practiced using other cluster tools having suitable process chambers, or in other suitable process chambers. For example, in some embodiments the inventive methods discussed above may advantageously be performed in a cluster tool such that there are no vacuum breaks between processes. For example, the elimination of vacuum breaks may limit or prevent contamination (oxidation) of the substrate between processes.

FIG. 6 is a diagram of the cluster tool 600 that is configured for substrate fabrication, e.g., post poly plug fabrication. The cluster tool 600 includes one or more vacuum transfer modules (VTM; VTM 601 and VTM 602 shown in FIG. 6), a front-end module 604, a plurality of processing chambers/modules 606, 608, 610, 612, 614, 616, and 618, and a process controller 620 (controller 620). In embodiments with more than one VTM, such as is shown in FIG. 6, one or more pass-through chambers may be provided to facilitate vacuum transfer from one VTM to another VTM. In embodiments consistent with that shown in FIG. 6, two pass-through chambers can be provided (e.g., pass-through chamber 640 and pass-through chamber 642). The front-end module 604 includes a loading port 622 that is configured to receive one or more substrates, for example from a FOUP (front opening unified pod) or other suitable substrate containing box or carrier, that are to be processed using the cluster tool 600. The loading port 622 can include three loading areas 624a-624c, which can be used for loading one or more substrates. However, greater or fewer loading areas can be used.

The front-end module 604 includes an atmospheric transfer module (ATM) 626 that is used to transfer a substrate that has been loaded into the loading port 622. More particularly, the ATM 626 includes one or more robot arms 628 (shown in phantom) that are configured to transfer the substrate from the loading areas 624a-624c to the ATM 626, through doors 635 (shown in phantom) that connects the ATM 626 to the loading port 622. There is typically one door for each loading port (624a-624c) to allow substrate transfer from respective loading port to the ATM 626. The robot arm 628 is also configured to transfer the substrate from the ATM 626 to air locks 630a, 630b through doors 632 (shown in phantom, one each for each air lock) that connect the ATM 626 to the air locks 630a, 630b. The number of airlocks can be more or less than two but for illustration purposes only, two airlocks (630a and 630b) are shown with each airlock having a door to connect the airlock to the ATM 626.

The air locks 630a, 630b, under the control of the controller 620, can be maintained at either an atmospheric pressure environment or a vacuum pressure environment, and serve as an intermediary or temporary holding space for a substrate that is being transferred to/from the VTM 601, 602. The VTM 601 includes a robot arm 638 (shown in phantom) that is configured to transfer the substrate from the air locks 630a, 630b to one or more of the plurality of processing chambers 606, 608, or to one or more pass-through chambers 640 and 642, without vacuum break, i.e., while maintaining a vacuum pressure environment within the VTM 602 and the plurality of processing chambers 606, 608 and pass-through chambers 640 and 642. The VTM 602 includes a robot arm 638 (in phantom) that is configured to transfer the substrate from the air locks 630a, 630b to one or more of the plurality of processing chambers 606, 608, 610, 612, 614, 616, and 618, without vacuum break, i.e., while maintaining a vacuum pressure environment within the VTM 602 and the plurality of processing chambers 606, 608, 610, 612, 614, 616, and 618. In certain embodiments, the air locks 630a, 630b can be omitted, and the controller 620 can be configured to move the substrate directly from the ATM 626 to the VTM 602.

A door 634, e.g., a slit valve door, connects each respective air lock 630a, 630b, to the VTM 601. Similarly, a door 636, e.g., a slit valve door, connects each processing module to the VTM to which the respective processing module is coupled (e.g., either the VTM 601 or the VTM 602). The plurality of processing chambers 606, 608, 610, 612, 614, 616, and 618 are configured to perform one or more processes that are typically associated with the substrate post poly plug fabrication as described herein.

The controller 620 controls the overall operations of the cluster tool 600 and includes a memory 621 to store data or commands/instructions related to the operation of the cluster tool 600. For example, the controller 620 controls the robot arms 628, 638, 639 of the ATM 626, VTM 601, VTM 602, respectively, for transferring the substrate to/from the VTM 601 and between the VTM 601 and the VTM 602. The controller 620 controls opening and closing of the doors 632, 634, 636, and controls the pressure of the air locks 630a, 630b, e.g., maintaining either atmospheric pressure/vacuum pressure environments within the air locks 630a, 630b as desired for substrate transfer processes. The controller 620 also controls operation of the individual processing chambers 606, 608, 610, 612, 614, 616, and 618 for performing the operations associated therewith, as described in greater detail below.

Figure 7:
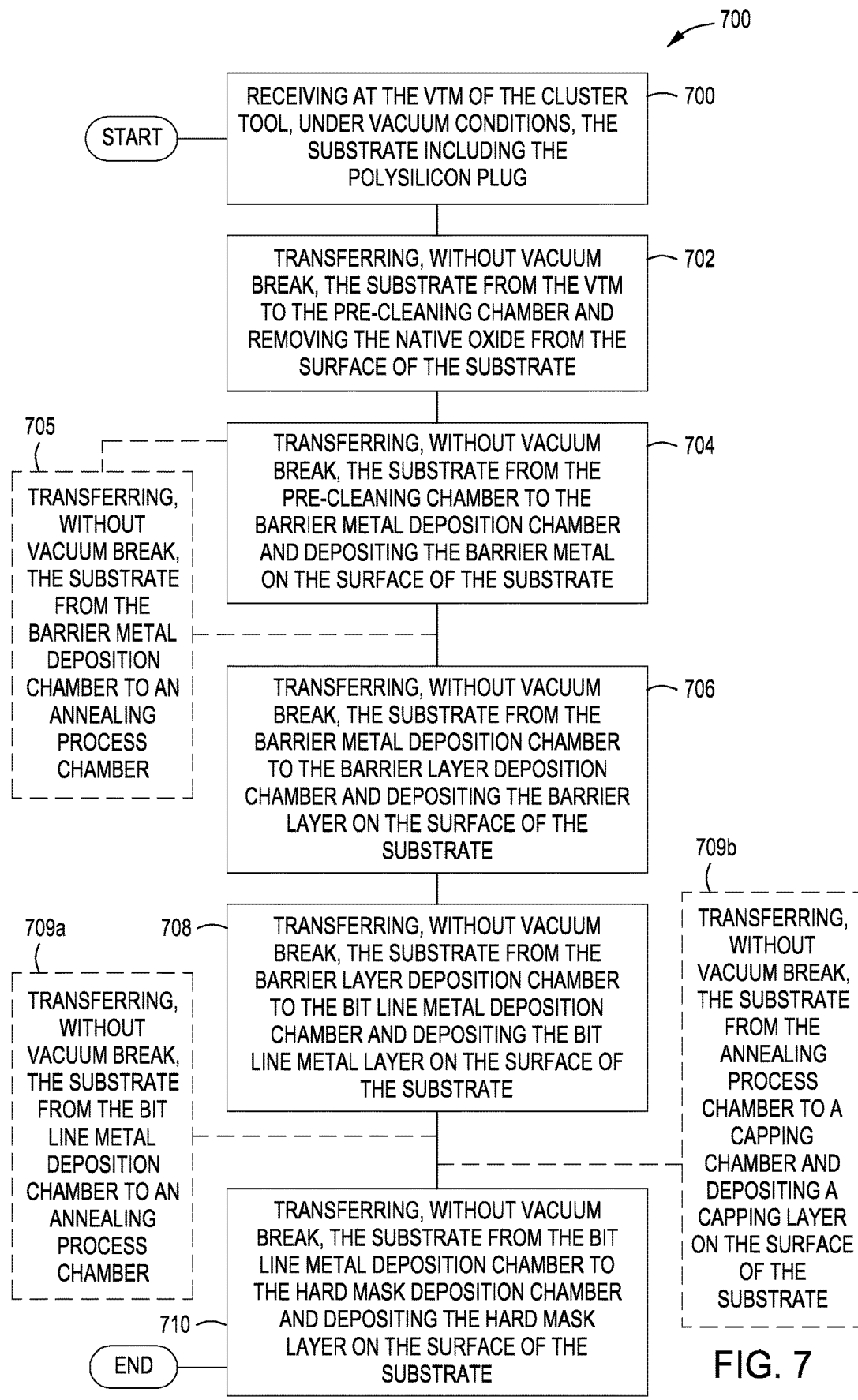
FIG. 7 is a method of substrate fabrication in accordance with some embodiments of the present principles.
Figure 8:
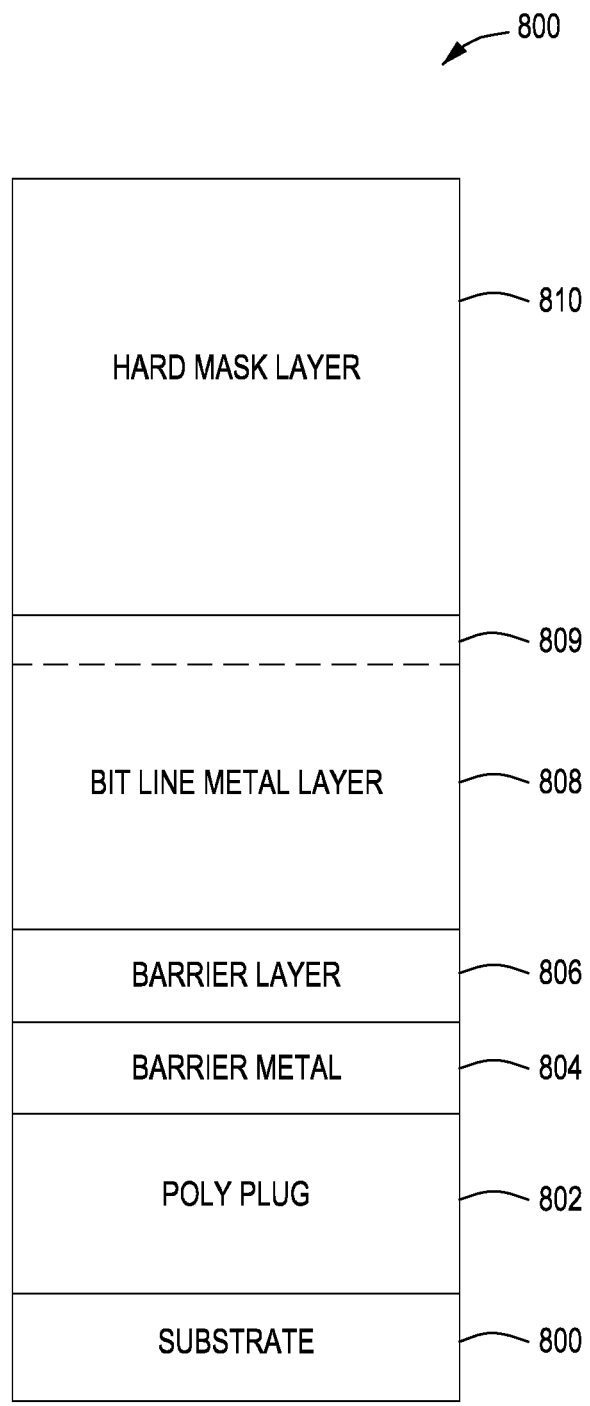
FIG. 8 is a cross-sectional view of a substrate in accordance with some embodiments of the present principles.

FIG. 7 is a method for performing one or more DRAM bit line stack processes, post poly plug fabrication, using the cluster tool 600. For illustrative purposes, FIG. 8 shows a cross-sectional view of a portion of the substrate 800 including the poly plug 802, e.g., after the poly plug 802 has been formed on the substrate 800 outside of the cluster tool 600. Prior to performing the method of FIG. 7, the substrate 800 can be loaded into the loading port 622, via one or more of the loading areas 624a-624c. The robot arm 628 of the ATM 626, under control of the controller 620, can transfer the substrate 800 having the poly plug 802 from the loading area 624a to the ATM 626.

The controller 620 can determine if at least one of the air locks 630a, 630b is at an atmospheric pressure environment, depending on if one or both air locks 630a, 630b is/are being used. For illustrative purposes, it is assumed that only the air lock 630a is being used. If the controller 620 determines that the air lock 630a is at an atmospheric pressure environment, the controller 620 can open the door (part of 632) that connects the ATM 626 to the air lock 630a. Conversely, if the controller 620 determines that the air lock 630a is not at an atmospheric pressure environment, the controller 620 can adjust the pressure within the air lock 630*a* to an atmospheric pressure environment (e.g., via a pressure control valve that is operably connected to the air locks 630*a*, 630*b* and controlled by the controller 620), and can recheck the pressure within the air lock 630*a*. The controller can instruct the robot arm 628 to transfer the substrate 800 from the ATM 626 to the air lock 630*a*, close the door 632, and adjust the pressure within the air lock 630*a* to a vacuum pressure environment, for example, matching or substantially matching the vacuum pressure environment inside of the VTM 601.

The controller 620 can determine if the air lock 630*a* is at a vacuum pressure environment. If the controller 620 determines that the air lock 630*a* is at a vacuum pressure environment, the controller can open the door 634 that connects the VTM 601 to the air lock 630*a*. Conversely, if the controller 620 determines that the air lock 630*a* is not at a vacuum pressure environment, the controller 620 can adjust the pressure within the air lock 630*a* to a vacuum pressure environment (e.g., via the pressure control valve that is operably connected to the air locks 630*a*, 630*b* and controlled by the controller 620), and recheck the pressure within the air lock 630*a*.

The controller 620 controls the operation of the tool 600 using a direct control of the process chambers or alternatively, by controlling the computers (or controllers) associated with the process chambers and the tool 600. In operation, the controller 620 enables data collection and feedback from the respective chambers and systems to optimize performance of the tool 600. The controller 620 generally includes a Central Processing Unit (CPU) 619, a memory 621, and a support circuit 625. The CPU 619 may be any form of a general purpose computer processor that can be used in an industrial setting. The support circuit 625 is conventionally coupled to the CPU 619 and may comprise a cache, clock circuits, input/output subsystems, power supplies, and the like. Software routines, such as a method as described above may be stored in the memory 621 and, when executed by the CPU 619, transform the CPU 619 into a specific purpose computer (controller 620). The software routines may also be stored and/or executed by a second controller (not shown) that is located remotely from the tool 600.

The memory 621 is in the form of computer-readable storage media that contains instructions, when executed by the CPU 619, to facilitate the operation of the semiconductor processes and equipment. The instructions in the memory 621 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

At 700, the controller 620 instructs the robot arm 638 to transfer the substrate 800 from the air lock 630*a* through the door 634 to the VTM 601 and closes the door 634. Alternatively, the door 634 can be left open, for example, to receive an outbound substrate upon completion of processing within the cluster tool 600. At 702, the controller 620 instructs the robot arm 638 to transfer the substrate 800 to one or more of the processing chambers so that fabrication of the substrate can be completed—i.e., completion of the bit line stack processes atop the poly plug 802 on the substrate 800. For example, at 702 the controller 620 can instruct the robot arm 638 to open the door 636 corresponding to the processing chamber 606. Once opened, the controller 620 can instruct the robot arm 638 to transfer (without vacuum break, i.e., the vacuum pressure environment is maintained within the VTM 601 and the VTM 602 while the substrate 800 is transferred between the processing chambers 606, 608, 610, 612, and 614) the substrate 800 to a pre-cleaning chamber (e.g., processing chamber 606). The processing chamber 606, can be used to perform one or more pre-cleaning process to remove contaminants that may be present on the substrate 800, e.g., native oxidation that can be present on the substrate 800. One such pre-cleaning chamber is the SiCoNi™ processing tool commercially available from Applied Materials, Inc. of Santa Clara, Calif.

Next, at 704 the controller 620 opens the door 636 and instructs the robot arm 638 to transfer the substrate 800 to the next processing chamber. For example, at 704 the controller 620 can instruct the robot arm 638 to transfer, without vacuum break, the substrate 800 from the pre-cleaning chamber to a barrier metal deposition chamber. For example, the controller 620 can instruct the robot arm 638 to transfer the substrate under vacuum from the processing chamber 606 to, for example, the processing chamber 608. The processing chamber 608 is configured to perform a barrier metal deposition process on the substrate 800 (e.g., to deposit a barrier metal 804 atop the cleaned substrate 800 and the poly plug 802). The barrier metal can be one of titanium (Ti) or tantalum (Ta).

Next, at 706 the controller 620 can instruct the robot arm 638 to transfer, without vacuum break, the substrate 800 from the barrier metal deposition chamber to a barrier layer deposition chamber or to an annealing chamber. If the substrate 800 is transferred to an annealing chamber, the substrate 800 will be brought back to the barrier metal deposition chamber for an oxidation prevention deposition (e.g., nitride variant of the barrier metal). After the barrier metal deposition chamber, the substrate 800 is transferred to the barrier layer deposition chamber. For example, the controller 620 can instruct the robot arm 638 to transfer the substrate under vacuum from the processing chamber 608 to either of the pass-through chambers 640, 642, at which point the robot arm 639 inside the VTM 602 can pick up the substrate 800 and move it to, for example, the processing chamber 610. The processing chamber 610 is configured to perform a barrier layer deposition process on the substrate 800 (e.g., to deposit a barrier layer 806 atop the barrier metal 804). The barrier layer can be one of titanium nitride (TiN), tantalum nitride (TaN), or tungsten nitride (WN).

Next, at 708 the controller 620 can instruct the robot arm 639 to transfer, without vacuum break, the substrate 800 from the processing chamber 610 to, for example, the processing chamber 612. The processing chamber 612 is configured to perform a bit line metal deposition process on the substrate 800 (e.g., to deposit a bit line metal layer 808 atop the barrier layer 806 deposited at 706)). The bit line metal can be one of tungsten (W), molybdenum (Mo), ruthenium (Ru), iridium (Ir), or rhodium (Rh). Next, at 710 the controller 620 can instruct the robot arm 639 to transfer, without vacuum break, the substrate 800 from the processing chamber 612 to, for example, the processing chamber 614. The processing chamber 614 is configured to perform a hardmask deposition process on the substrate 800 (e.g., to deposit a hardmask layer 810 atop the bit line metal layer 808 deposited at 708). The hardmask can be one of silicon nitride (SiN), silicon oxide (SiO), or silicon carbide (SiC).

In some embodiments, an annealing process can be performed on the substrate 800 prior to or after deposition of the barrier layer 806, as shown at 705. The annealing process can be any suitable annealing process, such as a rapid thermal processing (RTP) anneal. For example, prior to transferring the substrate 800 from the processing chamber 608 to the processing chamber 610, the substrate 800 can be first transferred to the processing chamber 616. The processing chamber 616 is configured to perform an annealing process on the substrate 800. Subsequent to the anneal process, the annealed substrate 800 including the barrier layer 806 can be transferred under vacuum from the annealing chamber (e.g., processing chamber 616) to the barrier layer deposition chamber (e.g., processing chamber 610), e.g., using the robot arm 639.

Alternatively or in combination, an annealing process can be performed on the substrate 800 after deposition of the bit line metal layer 808 and prior to depositing the hardmask layer 810 atop the bit line metal layer 808, as shown at 709a. For example, prior to transferring the substrate 800 from the processing chamber 612 to the processing chamber 614, the substrate 800 can be first transferred to the processing chamber 616 (i.e., an annealing chamber). An annealing process, or another annealing process if the anneal at 705 has been previously performed, can be performed on the substrate 800 having the bit line metal layer 808 deposited thereon as discussed above. In some embodiments where the annealing process is performed at 709a, the annealed substrate 800 can be transferred to another processing chamber to have an optional capping layer 809 deposited on the bit line metal layer 808, as shown at 709b. For example, the annealed substrate 800 including the bit line metal layer 808 can be transferred under vacuum from the annealing chamber (e.g., processing chamber 616) to a capping layer deposition chamber (e.g., processing chamber 618), e.g., using the robot arm 639 to deposit a capping layer atop the annealed bit line metal layer 808.

In some embodiments, after the bit line metal is deposited, some metals such as ruthenium (Ru) are grain growth materials. The inventors have observed that subsequent deposition of the hardmask layer atop such bit line metals at high temperatures will undesirably cause poor surface roughness. The inventors have discovered that annealing the bit line metal layer prior to deposition of the hardmask layer post deposition of a low temperature cap layer can advantageously improve the surface roughness of the bit line metal layer. By performing each of the above sequences in an integrated tool (e.g., the cluster tool 600), oxidation of the bit line metal during anneal for grain growth is further advantageously avoided.

Additional processes not herein described can also be performed on the substrate 800, or some of the processes described herein can be omitted.

After the above described processes associated with the processing chambers 608, 610, 612, and 614 (and chambers 616, 618 if used) have been performed on the substrate 800, the substrate 800 is transferred from the VTM 602 back to the loading port 622, e.g., using the robot arm 639 in the VTM 602 to transfer the substrate 800 to a pass-through chamber 640, 642, and using the robot arm 638 in the VTM 601 to transfer the substrate 800 from the pass-through chamber 640, 642 to one of the air locks 630a, 630b. The robot arm 628 can then be used to return the substrate 800 to an empty slot in the FOUP in the loading port 622.

The cluster tool 600 and methods of use described herein advantageously allow a user to perform a plurality of DRAM bit line processes on a poly plug using a single machine that is configured to maintain a vacuum pressure environment throughout the entire DRAM bit line process. Accordingly, the likelihood of oxidation occurring on the substrate during post substrate 800 fabrication is reduced, if not eliminated. Additionally, since the vacuum pressure environment is maintained throughout the entire DRAM bit line process, the choice of bit line metal materials is not limited by the grain growth characteristics of the metal.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if the value were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout the specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout the specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, these embodiments are merely illustrative of the principles and applications of the present disclosure. Those skilled in the art will appreciate that various modifications and variations can be made to the method and apparatus of the present disclosure without departing from the spirit and scope of the disclosure. Thus, the present disclosure includes modifications and variations that are within the scope of the appended claims and their equivalents.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of forming a memory structure, comprising:
   reducing a roughness of a top surface of a bit line metal layer by:
      depositing a titanium layer of approximately 30 angstroms to approximately 50 angstroms on a polysilicon layer on a substrate;
      depositing a first titanium nitride layer of approximately 15 angstroms to approximately 40 angstroms on the titanium layer;
      annealing the substrate, wherein the annealing is configured to reduce the roughness of the top surface of the bit line metal layer bar reducing a silicidation impact caused by subsequent annealing of a grain growth metal of the bit line metal layer;
      depositing a second titanium nitride layer of approximately 15 angstroms to approximately 40 angstroms on the first titanium nitride layer after annealing; and
      depositing the bit line metal layer of on the second titanium nitride layer, wherein the grain growth metal of the bit line metal layer is ruthenium.

2. The method of claim 1, further comprising:
   depositing a cap layer on the bit line metal layer at a deposition temperature of approximately 350 degrees Celsius to approximately 400 degrees Celsius; and
   depositing a hardmask layer on the cap layer at a deposition temperature of greater than approximately 500 degrees Celsius.

3. The method of claim 2, wherein the cap layer comprises one or more of silicon nitride or silicon carbonitride.

4. The method of claim 2, wherein the cap layer is approximately 30 angstroms to approximately 50 angstroms.

5. The method of claim 2, wherein the cap layer is deposited by a chemical vapor deposition (CVD) or atomic layer deposition (ALD) process.

6. The method of claim 2, wherein the hardmask layer comprises silicon nitride.

7. The method of claim 2, wherein the hardmask layer is deposited using a low pressure chemical vapor deposition (LPCVO) process.

8. The method of claim 1, further comprising:
   depositing a hardmask layer on the bit line metal layer at a deposition temperature of less than approximately 400 degrees Celsius.

9. The method of claim 8, wherein the hardmask layer comprises silicon nitride deposited using a low pressure chemical vapor deposition (LPCVD) process.

10. The method of claim 1, wherein the annealing is performed at a temperature of approximately 700 degrees Celsius to approximately 850 degrees Celsius.

11. A method of forming a memory structure, comprising:
    reducing a roughness of a top surface of a bit line metal layer by:
       forming a barrier metal layer on a polysilicon layer on a substrate;
       annealing the barrier metal layer, wherein the annealing is configured to reduce the roughness of the top surface of the bit line metal layer by reducing a silicidation impact caused by subsequent annealing of a grain growth metal of the bit line metal layer;
       forming a barrier layer on the barrier metal layer; and
       forming the bit line metal layer on the barrier layer, wherein the grain growth metal of the bit line metal layer is ruthenium.

12. The method of claim 11, wherein the barrier metal layer is a titanium layer of approximately 30 angstroms to approximately 50 angstroms formed on the polysilicon layer and a titanium nitride layer of approximately 15 angstroms to approximately 40 angstroms formed on the titanium layer.

13. The method of claim 12, wherein annealing the barrier t lays forms a titanium silicide layer on the polysilicon layer.

14. The method of claim 11, therein the barrier layer is nitride layer of approximately 15 angstroms to approximately 40 angstroms.

15. The method of claim 11, wherein the annealing is performed at a temperature of approximately 700 degrees Celsius to approximately 850 degrees Celsius.

16. The method of claim 11, further comprising:
    forming a cap layer on the bit line metal layer using a chemical vapor deposition (CVD) or atomic layer deposition (ALD) process at a deposition temperature of approximately 350 degrees Celsius to approximately 400 degrees Celsius; and
    forming a hardmask layer on the cap layer using a low pressure chemical vapor deposition (LPCVD) process at a deposition temperature of greater than approximately 500 degrees Celsius.

17. The method of claim 16, wherein the cap layer is approximately 30 angstroms to approximately 50 angstroms.

18. The method of claim 11, further comprising:
    depositing a hardmask layer on the bit line metal layer using a low pressure chemical vapor deposition (LPCVD) process at a deposition temperature of less than approximately 400 degrees Celsius.

19. A method of forming a memory structure, comprising:
    reducing a roughness of a top surface of a bit line metal layer by:
       depositing a titanium layer of approximately 30 angstroms to approximately 50 angstroms on a polysilicon layer on a substrate using a plasma vapor deposition (PVD) chamber;
       annealing the substrate without a vacuum break between the depositing of the titanium layer and the annealing of the substrate, wherein the annealing is configured to reduce the roughness of the top surface of the bit line metal layer by reducing a silicidation impact caused by subsequent annealing of a grain growth metal of the bit line metal layer;
       depositing a titanium nitride layer of approximately 15 angstroms to approximately 40 angstroms on the titanium layer after annealing; and
    depositing the bit line metal layer on the titanium nitride layer, wherein the grain growth metal of the bit line metal layer is ruthenium.

20. The method of claim 19, further comprising:
    annealing the substrate at a temperature of approximately 700 degrees Celsius to approximately 850 degrees Celsius; or
    depositing a cap layer on the bit line metal layer at a deposition temperature of approximately 350 degrees Celsius to approximately 400 degrees Celsius and depositing a hardmask layer on the cap layer at a deposition temperature of greater than approximately 500 degrees Celsius; or depositing a hardmask layer on the bit line metal layer at a deposition temperature of less than approximately 400 degrees Celsius.

* * * * *

UNITED STATES PATENT AND TRADEMARK OFFICE
CERTIFICATE OF CORRECTION

PATENT NO. : 10,903,112 B2  
APPLICATION NO. : 16/690620  
DATED : January 26, 2021  
INVENTOR(S) : Priyadarshi Panda et al.

Page 1 of 1

It is certified that error appears in the above-identified patent and that said Letters Patent is hereby corrected as shown below:

In the Claims

Column 15, Line 27, in Claim 1, delete "bar" and replace with "by"  
Column 15, Line 54, in Claim 7, delete "(LPCVO)" and replace with "(LPCVD)"  
Column 16, Line 18, in Claim 13, delete "t lays" and replace with "metal layer"  
Column 16, Line 19, in Claim 14, delete "therein" and replace with "wherein"  
Column 16, Line 20, in Claim 14, delete "nitride" and replace with "a titanium nitride"

Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*